United States Patent
Saitoh et al.

(10) Patent No.: US 9,330,925 B2
(45) Date of Patent: May 3, 2016

(54) THIN-FILM TRANSISTOR, MANUFACTURING METHOD THEREOF, AND ELECTRONIC APPARATUS USING THIN-FILM TRANSISTOR

(75) Inventors: Tohru Saitoh, Chiba (JP); Takaaki Ukeda, Osaka (JP); Kazunori Komori, Hyogo (JP); Sadayoshi Hotta, Osaka (JP)

(73) Assignee: JOLED INC., Tokyo (JP)

( * ) Notice: Subject to any disclaimer, the term of this patent is extended or adjusted under 35 U.S.C. 154(b) by 887 days.

(21) Appl. No.: 12/756,601

(22) Filed: Apr. 8, 2010

(65) Prior Publication Data

US 2010/0194719 A1    Aug. 5, 2010

Related U.S. Application Data

(63) Continuation of application No. PCT/JP2009/002311, filed on May 26, 2009.

(30) Foreign Application Priority Data

May 29, 2008    (JP) ................... 2008-140345

(51) Int. Cl.
*H01L 29/786* (2006.01)
*H01L 21/22* (2006.01)
*H01L 21/285* (2006.01)
(Continued)

(52) U.S. Cl.
CPC ........ *H01L 21/28512* (2013.01); *H01L 29/458* (2013.01); *H01L 29/66765* (2013.01); *H01L 27/1277* (2013.01)

(58) Field of Classification Search
CPC .................................................. H01L 27/1277
See application file for complete search history.

(56) References Cited

U.S. PATENT DOCUMENTS 5,773,329 A    6/1998    Kuo
6,492,213 B1 *  12/2002    Yoshinouchi et al. ........ 438/166
(Continued)

FOREIGN PATENT DOCUMENTS

JP    10-070077    3/1998
JP    2002-124683    4/2002
(Continued)

OTHER PUBLICATIONS

U.S. Appl. No. 12/742,137 to Takaaki Ukeda et al., which was filed on May 10, 2010.

*Primary Examiner* — Robert Bachner
*Assistant Examiner* — Molly Reida
(74) *Attorney, Agent, or Firm* — Greenblum & Bernstein, P.L.C.

(57) ABSTRACT

A thin-film transistor includes a substrate, a gate electrode over the substrate, an insulating layer over the gate electrode, and a semiconductor layer over the insulating layer. The semiconductor layer includes a channel region, a source region, and a drain region. A source electrode is over the source region, and a drain electrode is over the drain region. The source electrode and the drain electrode each comprise Ni and a metal other than Ni. The channel region, the source region, and the drain region comprise at least one of a polycrystalline silicon that is formed by crystallizing an amorphous silicon layer by thermally diffusing the Ni in the source electrode and the drain electrode into the semiconductor layer and a microcrystalline silicon that is formed by crystallizing an amorphous silicon layer by thermally diffusing the Ni in the source electrode and the drain electrode into the semiconductor layer.

5 Claims, 4 Drawing Sheets

(51) Int. Cl.
  *H01L 29/45* (2006.01)
  *H01L 29/66* (2006.01)
  *H01L 27/12* (2006.01)

(56) References Cited

U.S. PATENT DOCUMENTS

| | | |
|---|---|---|
| 2002/0009835 A1 | 1/2002 | Chen et al. |
| 2002/0167636 A1 | 11/2002 | Yasuda et al. |
| 2003/0040150 A1* | 2/2003 | Yamazaki et al. ............ 438/200 |
| 2004/0263706 A1* | 12/2004 | Cho et al. ........................ 349/43 |
| 2005/0263903 A1* | 12/2005 | Forbes ................ H01L 21/4846 257/763 |
| 2006/0033106 A1* | 2/2006 | Seo et al. ......................... 257/66 |
| 2006/0051914 A1* | 3/2006 | Kakehata et al. ............. 438/197 |
| 2006/0071211 A1 | 4/2006 | Lee |
| 2007/0284580 A1* | 12/2007 | Lim .................. H01L 29/66765 257/66 |
| 2007/0284742 A1* | 12/2007 | Inoue et al. ................... 257/749 |

FOREIGN PATENT DOCUMENTS

| | | |
|---|---|---|
| JP | 2002-341375 | 11/2002 |
| JP | 2005-38981 | 2/2005 |
| JP | 2006-108623 | 4/2006 |
| JP | 2007-317934 | 12/2007 |

* cited by examiner

THIN-FILM TRANSISTOR, MANUFACTURING METHOD THEREOF, AND ELECTRONIC APPARATUS USING THIN-FILM TRANSISTOR

CROSS REFERENCE TO RELATED APPLICATION

This is a continuation application of PCT application No. PCT/JP2009/002311 filed May 26, 2009, designating the United States of America, the disclosure of which, including the specification drawings, and claims, is incorporated herein by reference in its entirety.

The disclosure of Japanese Patent Application No. 2008-140345 filed on May 29, 2008, including specification, drawings, and claims, is incorporated herein by reference in its entirety.

BACKGROUND OF THE INVENTION

1. Field of the Invention

The present invention relates to a thin-film transistor, a manufacturing method thereof, and an electronic apparatus using the thin-film transistor.

2. Description of the Related Art

For example, in an electronic apparatus (for example, a television receiver) using an organic electroluminescence display device or a liquid crystal display device, thin-film transistors drive display elements which are arranged in a matrix to make up the organic electroluminescence display device or the liquid crystal display device.

In addition, the thin-film transistor has a structure as described below.

Specifically, the thin-film transistor includes: a substrate; a gate electrode provided on the substrate; an insulating layer covering the gate electrode; a semiconductor layer provided on the insulating layer; and a source-drain electrode provided on a source-drain region at each side of a channel region in the semiconductor layer (a similar technique is described in, for example: Japanese Unexamined Patent Application Publication No. 2006-108623).

SUMMARY OF THE INVENTION

A conventional thin-film transistor in the above example has a problem of low productivity.

Specifically, in the conventional thin-film transistor, in order to accelerate crystallization of a semiconductor layer, after serially providing a gate electrode, an insulating layer, and a semiconductor layer on a substrate, a crystallization induction metal layer is provided on a source-drain region at each side of a channel region in the semiconductor layer, and then heating is performed.

Then, after the crystallization of the semiconductor layer is accelerated by the heating through the crystallization induction metal layer, the crystallization induction metal layer is removed, and a source-drain electrode is formed on the source-drain region at each side of the channel region in the semiconductor layer.

That is, in the prior art example, the crystallization induction metal layer, which is provided to accelerate the crystallization of the semiconductor layer, is supposed to be removed before forming the source-drain electrode, and such necessity of removal processing makes productivity lower.

In addition, according to the conventional technique, unevenness in film thickness of the crystallization induction metal layer causes unevenness of crystallization, which causes, as a result, unevenness in transistor properties, thus causing unevenness in luminance of the organic electroluminescence display device or the liquid crystal display device.

Thus, in order to achieve the object, the thin-film transistor according to an aspect of the present invention includes: a substrate; a gate electrode provided on the substrate; an insulating layer covering the gate electrode; a semiconductor layer provided on the insulating layer; and a source-drain electrode provided on a source-drain region at each side of a channel region in the semiconductor layer, and the channel region and the source-drain region are made of polycrystalline silicon or microcrystalline silicon, and the source-drain electrode is made primarily of a metal other than Ni and evenly contains Ni at a predetermined concentration, so as to achieve the desired object.

In other words, in the present invention, the source-drain electrode is used which is primarily made of the metal other than Ni and which evenly contains Ni at a predetermined concentration, instead of having a laminated structure made up of a crystallization induction metal layer and a source-drain electrode. Since Ni contained in the source-drain electrode produces an effect of inducing crystallization, it is possible to increase productivity without forming and removing the crystallization induction metal layer. Furthermore, it is also possible to suppress unevenness in transistor properties which is caused by unevenness of the film thickness of the crystallization induction metal layer.

BRIEF DESCRIPTION OF THE DRAWINGS

These and other objects, advantages and features of the invention will become apparent from the following description thereof taken in conjunction with the accompanying drawings that illustrate a specific embodiment of the invention.

In the Drawings.

DESCRIPTION OF THE PREFERRED EMBODIMENT

An embodiment of the present invention will be described below with reference to the attached drawings.

Figure 1:
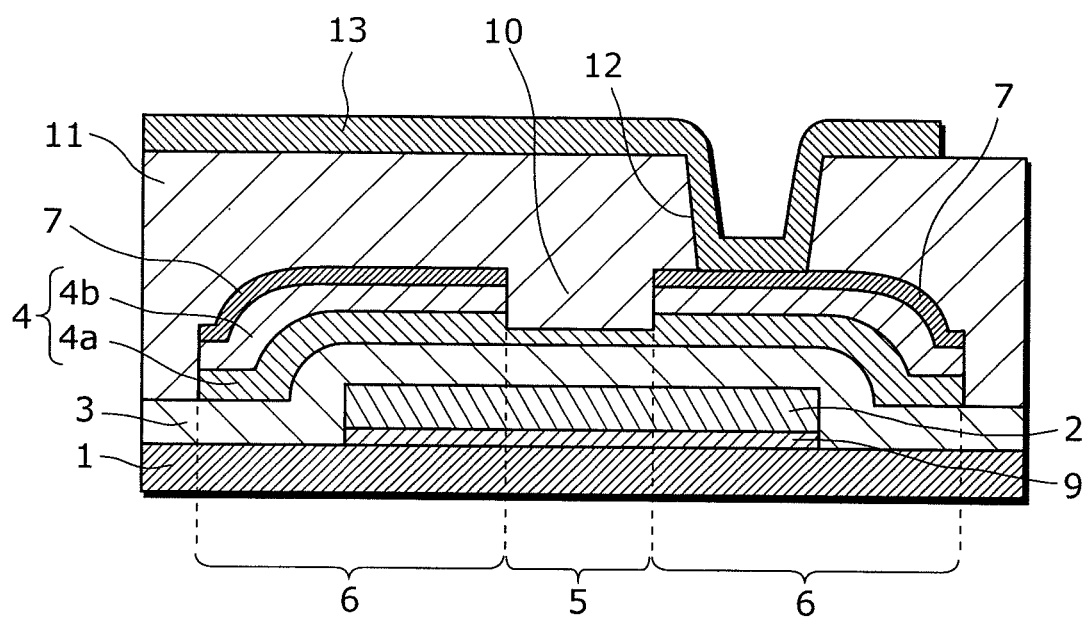
FIG. 1 is a cross-sectional view of a thin-film transistor according to an embodiment of the present invention.

FIG. 1 shows a thin-film transistor according to an embodiment of the present invention, and the thin-film transistor includes: a substrate 1; a gate electrode 2 provided on the substrate 1; an insulating layer 3 covering the gate electrode 2; and a semiconductor layer 4 provided on the insulating layer 3; and a source-drain electrode 7 provided on a source-drain region 6 at each side of a channel region 5 in the semiconductor layer 4.

Note that for the source-drain region 6, a portion at one end of the channel region 5 in the semiconductor layer 4 is a source region, and a portion at the other end is a drain region. Likewise, for the source-drain electrode 7, one of physically-separated portions is a source electrode, and the other portion is a drain electrode. Then, the source electrode is provided on the source region, and the drain electrode is provided on the drain region.

To describe a structure of the thin-film transistor in further detail, first, the substrate 1 is made of glass, for example, a silicon oxide layer 9 is provided on a top surface of the substrate 1, and the gate electrode 2 is provided on a top surface of the silicon oxide layer 9 by sputtering, for example, Mo.

In addition, the semiconductor layer 4 includes: a first semiconductor layer 4a in a rear surface side, and a second semiconductor layer 4b in a top surface side thereof. The first semiconductor layer 4a is formed by crystallizing non-doped amorphous silicon, and the second semiconductor layer 4b is formed by crystallizing n-type or p-type amorphous silicon. Accordingly, the channel region 5 and the source-drain region 6 in the semiconductor layer 4 are made of polycrystalline silicon or microcrystalline silicon.

The source-drain electrode 7 is primarily made of a metal other than Ni and also evenly contains Ni at a predetermined concentration. Preferably, the source-drain electrode contains Ni at a rate of 1% or less. An upper portion of the first semiconductor layer 4a, the entire second semiconductor layer 4b, and the entire source-drain electrode 7 which correspond to the channel region 5 in the semiconductor layer 4 are removed as shown in FIG. 1, so that one source-drain electrode 7 provided on a corresponding one of the right and left sides becomes the source electrode, and the other source-drain electrode 7 becomes the drain electrode.

In addition, with this removal, in the channel region 5 in the semiconductor layer 4, a recessed portion 10 which reaches as far as the upper portion of the first semiconductor layer 4a is formed, and the channel region 5 in the semiconductor layer 4 has a layer thickness smaller than the layer thickness of the source-drain region 6 of the semiconductor layer 4 due to such inclusion of the recessed portion 10. The channel region 5 is formed at a bottom of the recessed portion 10 provided on a surface of the semiconductor layer 4.

Furthermore, on the source-drain electrode 7, a planarizing layer 11 made of a photosensitive coating film is formed, and part of wiring 13 is provided via a through hole 12 in the planarizing layer 11, so that the source-drain electrode 7 and the wiring 13 are connected to each other.

Then, the thin-film transistor according to the present embodiment is connected, via the wiring 13 described above, to display elements arranged in a matrix in a display device (an organic electroluminescence display device or a liquid crystal display device) which is included in, for example, a television receiver, and is used for a drive circuit for driving the display elements.

Next, a method of manufacturing the thin-film transistor according to the present embodiment will be described.

Figure 2A:
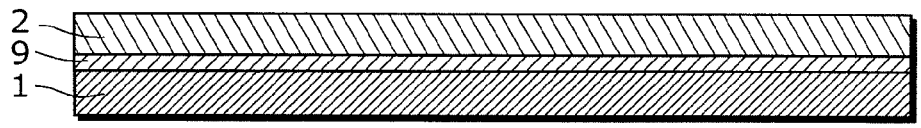
FIG. 2A is a cross-sectional view showing a manufacturing method according to an embodiment of the present invention.
Figure 2B:
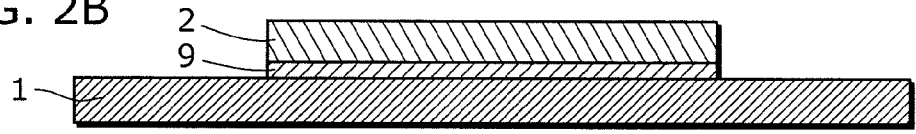
FIG. 2B is a cross-sectional view showing a manufacturing method according to an embodiment of the present invention.

First, as shown in FIG. 2A, the silicon oxide layer 9 and the gate electrode 2 are provided on the substrate 1, and are patterned, as shown in FIG. 2B, by a lithography method, an etching method, and so on.

Figure 2C:
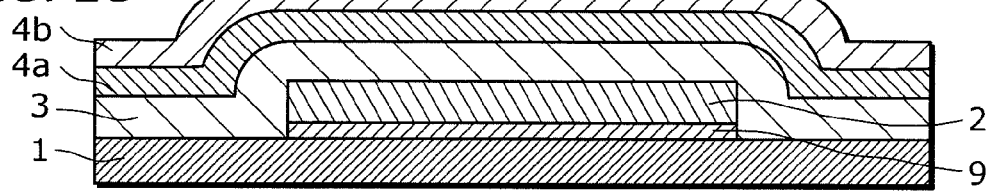
FIG. 2C is a cross-sectional view showing a manufacturing method according to an embodiment of the present invention.

Next, as shown in FIG. 2C, the insulating layer 3, the first semiconductor layer 4a, and the second semiconductor layer 4b are formed to cover the gate electrode 2, and the second semiconductor layer 4b including n-type impurities or p-type impurities (Phosphorus or Boron) is formed. As a result, the first semiconductor layer 4a and the second semiconductor layer 4b which are amorphous semiconductor layers are provided on the insulating layer 3.

Figure 2D:
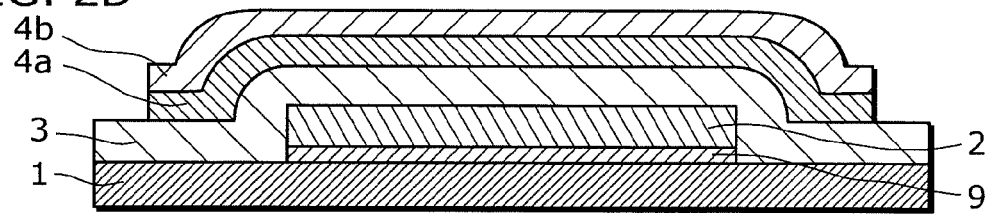
FIG. 2D is a cross-sectional view showing a manufacturing method according to an embodiment of the present invention.

Subsequently, as shown in FIG. 2D, the first semiconductor layer 4a and the second semiconductor layer 4b are patterned by the lithography method, the etching method, and so on.

Figure 2E:
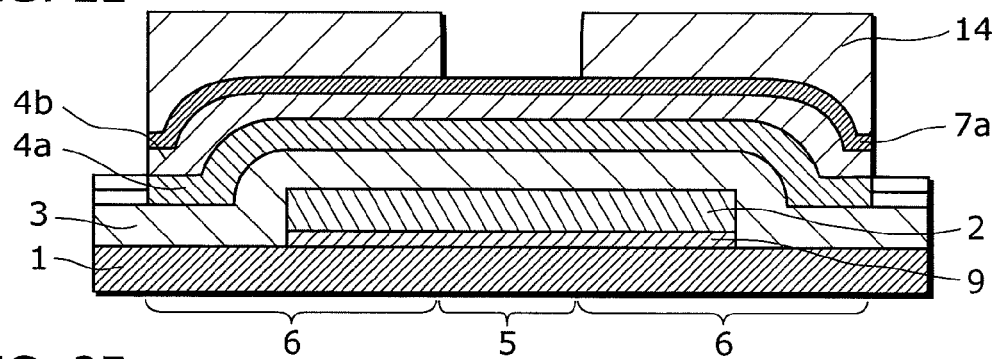
FIG. 2E is a cross-sectional view showing a manufacturing method according to an embodiment of the present invention.

Next, as shown in FIG. 2E, provided by the sputtering method are: an electrode layer 7a which is primarily made of a metal other than Ni, for example, Mo and which evenly contains Ni at a predetermined concentration, that is, for example, an electrode layer 7a containing 1% Ni (in the case of a Mo layer containing Ni, for example); and further, a photoresist 14 which has opening at the channel region 5. At this time, a preferable manufacturing method for the electrode layer 7a is to use a target made primarily of Mo and evenly containing approximately 1% Ni as a material target used for the sputtering method, which allows forming the electrode layer 7a made primarily of Mo and evenly containing 1% Ni by a conventional simple sputtering method. An example in which a Ni content is 1% has been described above, but it is possible to control the Ni content of the electrode layer 7a by controlling the Ni content of the target. The Ni included in the electrode layer 7a is caused to diffuse into the first semiconductor layer 4a and the second semiconductor layer 4b by a subsequent heating treatment, and accelerates crystallization. At this time, the degree of acceleration of the crystallization varies according to an amount of Ni diffusion. In the present embodiment, since the amount of Ni diffusion depends on the Ni content and does not depend on process conditions such as the film thickness of the electrode layer 7a, unevenness in the amount of Ni diffusion can be reduced, so that uniformity of crystallization, and further, uniformity of transistor properties can be significantly improved.

When the amount of the Ni diffusion is too large, the Ni remaining in a channel causes deterioration in the transistor properties, and thus it is preferable that the electrode layer 7a contain Ni at a rate of 1% or less. In addition, it is preferable that the Ni content be 0.01% or more as a minimum content required for acceleration of crystallization.

Figure 2F:
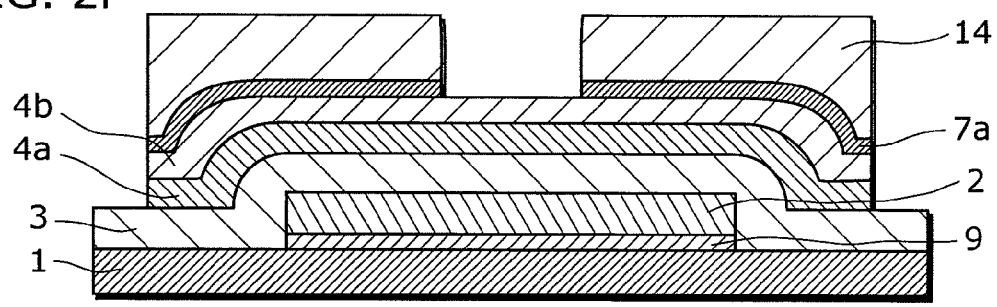
FIG. 2F is a cross-sectional view showing a manufacturing method according to an embodiment of the present invention.

Subsequently, as shown in FIG. 2F, by utilizing the opening of the photoresist 14, a portion of the electrode layer 7a, which corresponds to the channel region 5, is removed by etching. Specifically, by removing the portion of the electrode layer 7a, which is located on the channel region 5 in the first semiconductor layer 4a and the second semiconductor layer 4b, the electrode layer 7a which becomes a source-drain electrode 7 is provided on the source-drain region 6 at each side of the channel region 5 in the first semiconductor layer 4a and the second semiconductor layer 4b.

Figure 3A:
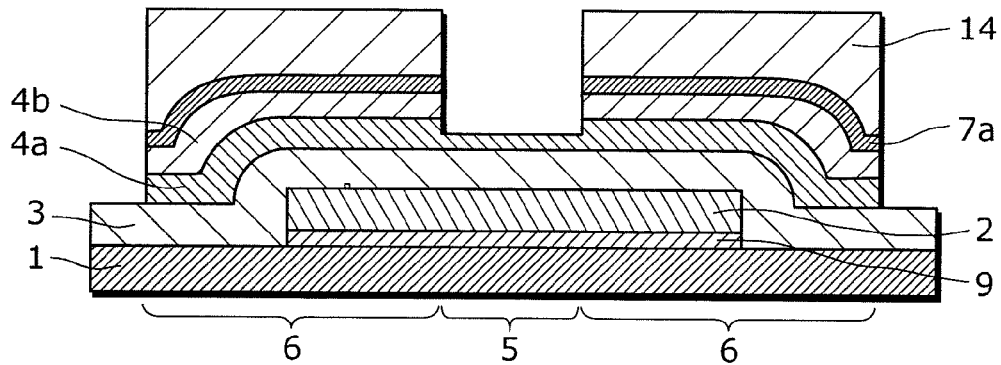
FIG. 3A is a cross-sectional view showing a manufacturing method according to an embodiment of the present invention.

Next, as shown in FIG. 3A, etching is further performed by utilizing the opening of the photoresist 14, so that the entire second semiconductor layer 4b and only an upper portion of the first semiconductor layer 4a, which correspond to the channel region 5, are removed.

In other words, in the present embodiment, the channel region 5 in the first semiconductor layer 4a is formed by forming a recess in a portion corresponding to the channel region 5 in the first semiconductor layer 4a using etching, so that, as shown in FIG. 3A, the channel region 5 in the first semiconductor layer 4a has a layer thickness smaller than the layer thickness of the source-drain region 6.

Next, the substrate 1 shown in FIG. 3A, from which the photoresist 14 has been removed, is set into an electric furnace. With this heating, the first semiconductor layer 4a and the second semiconductor layer 4b are crystallized into a polycrystalline semiconductor or a microcrystalline semiconductor.

Figure 3B:
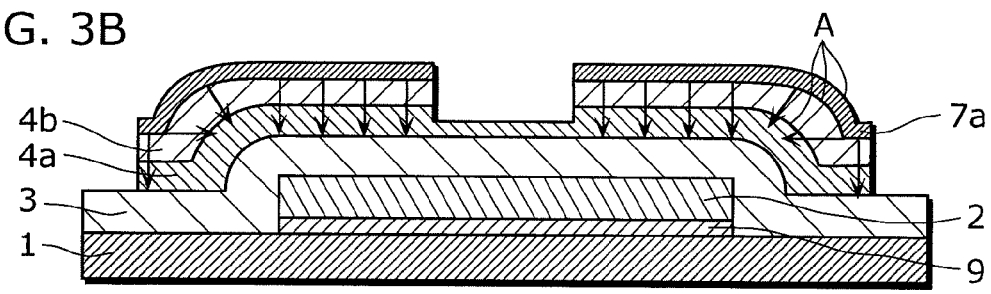
FIG. 3B is a cross-sectional view showing a manufacturing method according to an embodiment of the present invention.

The substrate 1 is gradually heated as traveling in this electric furnace, and FIG. 3B schematically shows a state in an initial stage of the traveling, in which the substrate 1 is heated to a temperature of 300 degrees to 350 degrees in the electric furnace.

Specifically, in FIG. 3B, the n-type impurities or p-type impurities (Phosphorus or Boron) included in the second semiconductor layer 4b partially diffuse into the first semiconductor layer 4a, and further, as shown in FIG. 3B, the Ni contained in the electrode layer 7a starts diffusion movement toward the first semiconductor layer 4a and the second semiconductor layer 4b.

Here, an important point is that, as described above, outer peripheral portions of the insulating layer 3, the first semiconductor layer 4a, the second semiconductor layer 4b, and the electrode layer 7a are extended to reach a point outside an outer peripheral portion of the gate electrode 2.

In other words, when the outer peripheral portions of the insulating layer 3, the first semiconductor layer 4a, the second semiconductor layer 4b, and the electrode layer 7a are extended to reach a point outside the outer peripheral portion of the gate electrode 2, outer peripheral portions of the first semiconductor layer 4a, the second semiconductor layer 4b, and the electrode layer 7a (portions outside the outer peripheral portion of the gate electrode 2) curve toward the substrate 1 as shown in FIG. 3B, so that a curved surface A (or a sloping surface) facing each side of the channel region 5 in the first semiconductor layer 4a is provided in the outer peripheral portions of the first semiconductor layer 4a, the second semiconductor layer 4b, and the electrode layer 7a.

Note that the state referred to as "a curved surface A (or a sloping surface) facing each side of the channel region 5 in the first semiconductor layer 4a is provided" in the outer peripheral portions of the first semiconductor layer 4a, the second semiconductor layer 4b, and the electrode layer 7a is a state in which the curved surface A (or the sloping surface) faces each side of the channel region 5 in the first semiconductor layer 4a when the thin-film transistor according to the present embodiment is cut in a longitudinal direction as shown in FIG. 3B.

In addition, in this context, only the electrode layer 7a need not have a curved surface or a sloping surface facing each side of the channel region 5 in the first semiconductor layer 4a.

Although not sufficiently clarified at present, by forming the curved face A as described above, an orbit (an oblique arrow or a horizontal arrow) toward each side of the channel region 5 in the first semiconductor layer 4a is created in the outer peripheral portions of the first semiconductor layer 4a and the second semiconductor layer 4b, as an orbit of Ni moving from the electrode layer 7a toward the first semiconductor layer 4a and the second semiconductor layer 4b as shown in FIG. 3B, and this, as a result, largely contributes to the crystallization of the channel region 5.

That is, silicon crystallization of the first semiconductor layer 4a and the second semiconductor layer 4b is significantly promoted by the above-described Ni activating as a catalyst for accelerating the crystallization when the substrate 1 is heated to 500 degrees or higher with the traveling of the substrate 1 in the electric furnace.

Figure 3C:
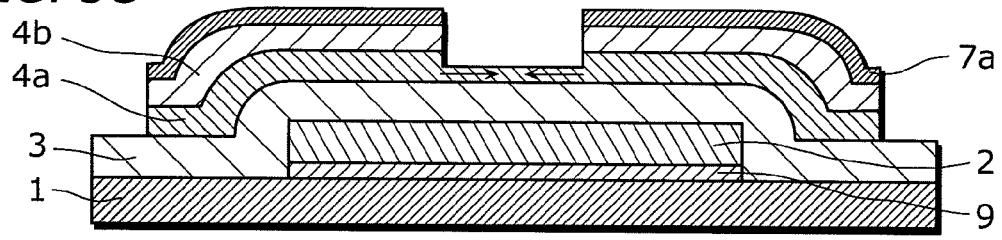
FIG. 3C is a cross-sectional view showing a manufacturing method according to an embodiment of the present invention.

As is clear from FIG. 3B, since the channel region 5 in the first semiconductor layer 4a is provided distant from the electrode layer 7a and also has a layer thickness smaller than that of the source-drain region 6 as described above, it becomes difficult for the Ni to reach the channel region 5. However, according to the present embodiment, as schematically shown in FIG. 3C, the Ni can reach, as a result, the channel region 5 and promote crystallization, and can thus perform its property sufficiently. It can be considered that this is because the curved surface A (or the sloping surface) facing each side of the channel region 5 in the first semiconductor layer 4a is provided in the outer peripheral portions of the first semiconductor layer 4a, the second semiconductor layer 4b, and the electrode layer 7a as described above (it can also be considered that, like the Ni described above, Phosphorus and Boron doped in the second semiconductor layer 4b are also caused to move toward the channel region 5 in the first semiconductor layer 4a).

In addition, as shown in FIG. 3C, as a result of being heated at 500 degrees or higher, the electrode layer 7a becomes the source-drain electrode 7 shown in FIG. 1.

Figure 3D:
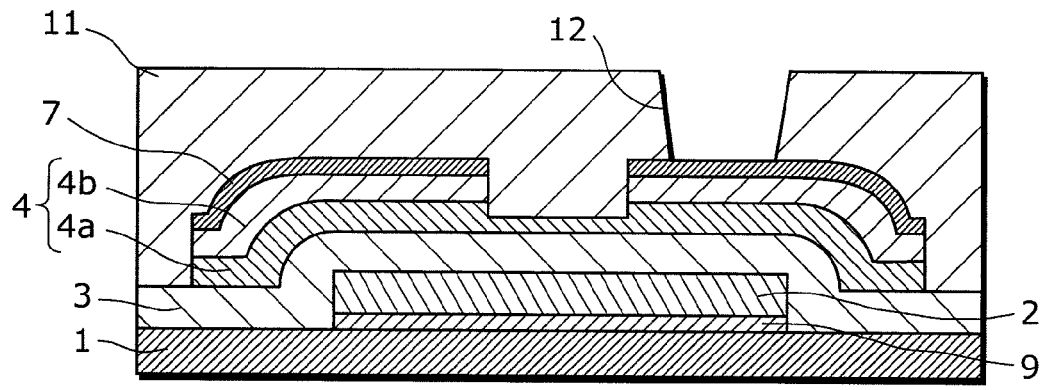
FIG. 3D is a cross-sectional view showing a manufacturing method according to an embodiment of the present invention.

Next, as shown in FIG. 3D, a through hole 12 can be easily formed by providing the planarizing layer 11 made of photosensitive resin on the source-drain electrode 7 and then performing lithographic exposure and development.

In addition, subsequent to FIG. 3D, a wiring layer (not shown) is formed by sputtering and then patterned by the lithographic method or the etching method so as to form the wiring 13, so that the thin-film transistor is finalized as shown in FIG. 1.

Then, the thin-film transistor according to the present embodiment is connected, via the wiring 13 described above, to display elements arranged in a matrix in a display device (an organic electroluminescence display device or a liquid crystal display device) which is included in, for example, a television receiver, and is used in a drive circuit for driving the display elements.

For example, since the thin-film transistor according to the present embodiment is to be used in the display device of the television receiver, the thin-film transistor can significantly contribute to increased efficiency of the electronic apparatus as a whole.

In addition, since the thin-film transistor according to the present embodiment does not require a process for removing the Ni layer which has been used for accelerating crystallization as described above, the manufacturing process is simplified and becomes more productive.

Note that in the present embodiment, an electrode primarily made of Mo and containing Ni is provided as the source-drain electrode 7, but the source-drain electrode 7 may also contain, as a primary component metal, a metal other than Mo, such as Al, Cu, W, Au, Ag, and Ti, for example.

Figure 4:
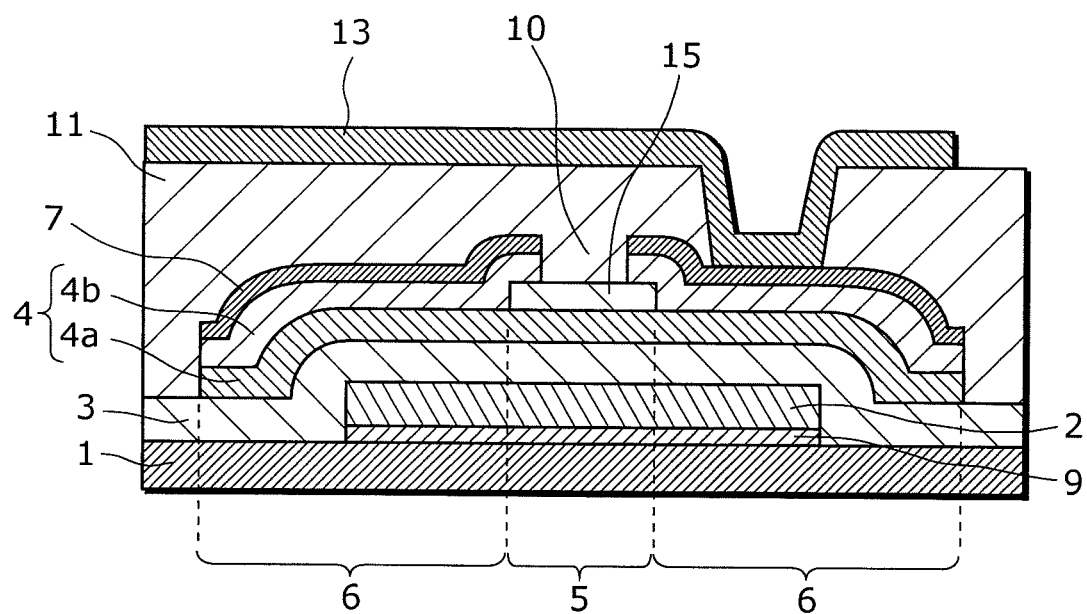
FIG. 4 is a cross-sectional view of a thin-film transistor according to another aspect of the present invention.

FIG. 4 shows another embodiment of the present invention, in which the thin-film transistor has a structure as described below.

Note that the same constituent elements as those shown in the above FIGS. 1 to 3D are appended with the same numerical references, and descriptions thereof will be omitted.

Specifically, the thin-film transistor shown in FIG. 4 includes an etching protection layer 15 as, for example, a silicon nitride layer which is provided on the channel region 5 in the first semiconductor layer 4a.

More specifically, the etching protection layer 15 as the silicon nitride layer, for example, is provided on the channel region 5 in the first semiconductor layer 4a, and the second semiconductor layer 4b is subsequently formed thereon.

The thin-film transistor shown in FIG. 4 is manufactured by: (i) providing the gate electrode 2 on the substrate 1, the insulating layer 3 such that the gate electrode 2 is covered with the insulating layer 3, the first semiconductor layer 4a on the insulating layer 3 as a first amorphous semiconductor layer, the etching protection layer 15 on the channel region 5 in the first semiconductor layer 4a, the second semiconductor layer 4b on the first semiconductor layer 4a as a second amorphous semiconductor layer such that the etching protection layer 15 is covered with the second semiconductor layer 4b, and the electrode layer 7a made primarily of a metal other than Ni and evenly containing Ni at a predetermined concentration, on the second semiconductor layer 4b; (ii) providing the source-drain electrode 7 on the source-drain region 6 at each side of the channel region 5 in the first semiconductor layer 4a by removing portions of the electrode layer 7a and the second semiconductor layer 4b, which are located on the channel region 5 in the first semiconductor layer 4a; and subsequently (iii) crystallizing the first semiconductor layer 4a and the second semiconductor layer 4b into a polycrystalline semiconductor or a microcrystalline semiconductor by heating the source-drain electrode 7.

At this time, by extending the outer peripheral portions of the insulating layer 3, the first semiconductor layer 4a, and the second semiconductor layer 4b to a point outside the outer peripheral portion of the gate electrode 2, a curved surface or a sloping surface is provided in the outer peripheral portions of the first semiconductor layer 4a and the second semiconductor layer 4b such that the curved surface or the sloping surface faces each side of the channel region 5 in the first semiconductor layer 4a. In addition, the electrode layer 7a has a Ni content of 1% or less.

Thus, FIG. 2C shows a state in the middle of the process for providing the etching protection layer 15 as a silicon nitride layer, for example, on the channel region 5 in the first semiconductor layer 4a and then providing the second semiconductor layer 4b.

Thus, almost the same processing from FIGS. 2D to 3D is to be performed subsequently. However, particularly in the processing corresponding to FIG. 3A, in the thin-film transistor according to the embodiment shown in FIG. 4, the etching is performed on the channel region 5 in the first semiconductor region 4a due to the effect produced by the etching protection layer 15, thus resulting in a uniform thickness of the channel region 5 in the first semiconductor layer 4a.

In other words, when numerous thin-film transistors as the transistor shown in FIG. 4 are horizontally arranged, a problem of property variation is caused by uneven thickness of the channel region 5 in the first semiconductor layer 4a between adjoining thin-film transistors.

If this is the case, as described in the present embodiment, it is possible to solve the problem of property variation by providing the etching protection layer 15 on the channel region 5 in the first semiconductor layer 4a because such provision achieves uniformity in thickness of the channel region 5 in the first semiconductor layer 4a in each adjoining thin-film transistor.

Thus far, an embodiment of the thin-film transistor according to the present invention has been described, but the present invention is not limited to the embodiment. Those skilled in the art will readily appreciate that many modifications are possible in the exemplary embodiment without materially departing from the novel teachings and advantages of this invention. Accordingly, all such modifications are intended to be included within the scope of this invention.

INDUSTRIAL APPLICABILITY

As described above, according to the present invention, it is possible to increase productivity of a thin-film transistor, and to improve properties of the thin-film transistor.

Accordingly, it is also possible to achieve reduced cost and improved properties in different electronic apparatuses using the thin-film transistor according to the present invention.

What is claimed is:

1. A method for manufacturing a thin-film transistor, comprising:
   providing a gate electrode over a substrate;
   providing an insulating layer over the gate electrode;
   providing a first amorphous silicon layer over the insulating layer, the first amorphous silicon layer including a channel region between a source region and a drain region;
   providing an etching protection layer on the channel region of the first amorphous silicon layer;
   providing a second amorphous silicon layer on the first amorphous silicon layer, the second amorphous silicon layer covering the etching protection layer;
   providing a source electrode directly on the second amorphous silicon layer and over the source region of the first amorphous silicon layer, the source electrode comprising Ni and a metal other than Ni, the source electrode containing the Ni approximately evenly at a predetermined concentration;
   providing a drain electrode directly on the second amorphous silicon layer and over the drain region of the first amorphous silicon layer, the drain electrode comprising Ni and a metal other than Ni, the drain electorde containing the Ni approximately evenly at the predetermined concentration;
   heating the first amorphous silicon layer to a first temperature during a first heating process to diffuse impurities from the second amorphous silicon layer to the first amorphous silicon layer; and
   distributing the approximately evenly distributed Ni from the source electrode and the drain electrode into the first amorphous silicon layer and the second amorphous silicon layer by heating the thin-film transistor in a furnace to a second temperature during a second heating process to promote uniformity of crystallization, the Ni of the source electrode and the drain electrode diffusing into the first amorphous silicon layer and the second amorphous silicon layer thereby accelerating crystallization of the first amorphous silicon layer and the second amorphous silicon layer into one of a polycrystalline and a microcrystalline semiconductor,
   wherein the first temperature is lower than the second temperature,
   outer arcs of the insulating layer, the first amorphous silicon layer, the second amorphous silicon layer, the source electrode, and the drain electrode are not inwards of a periphery of the gate electrode, and extend outside the periphery of the gate electrode, the outer arcs of the insulating layer, the first amorphous silicon layer, the second amorphous silicon layer, and one of the source electrode and the drain electrode being concentric, and
   the source electrode and the drain electrode are not provided on side surfaces of the first amorphous silicon layer and the second amorphous silicon layer to promote uniformity of crystallization, the side surfaces being perpendicular to a top surface of the substrate.

2. The method for manufacturing the thin-film transistor according to claim 1, further comprising:
providing the insulating layer, the first amorphous silicon layer, and the second amorphous silicon layer beyond ends of the gate electrode to provide one of a curved surface and a sloped surface as the outer arc on each of outer portions of the first amorphous silicon layer and the second amorphous silicon layer, the one of the curved surface and the sloped surface one of curving and sloping toward the channel region of the first amorphous silicon layer.

3. The method for manufacturing the thin-film transistor according to claim 1, further comprising:
providing an electrode layer over the second amorphous silicon layer, the electrode layer comprising the Ni and the metal other than Ni; and
removing portions of the electrode layer and the second amorphous silicon layer over the channel region of the first amorphous silicon layer to define the source electrode and the drain electrode.

4. The method for manufacturing the thin-film transistor according to claim 1, wherein the channel region has a thickness less than a thickness of each of the source region and the drain region.

5. The method for manufacturing the thin-film transistor according to claim 1, wherein the predetermined concentration is at least .01% and at most 1.0%.

* * * * *